United States Patent
Hogg

(10) Patent No.: US 6,854,092 B2
(45) Date of Patent: Feb. 8, 2005

(54) REDUCING VARIATION IN RANDOMIZED NANOSCALE CIRCUIT CONNECTIONS

(75) Inventor: Tad Hogg, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 211 days.

(21) Appl. No.: 10/216,987

(22) Filed: Aug. 12, 2002

(65) Prior Publication Data

US 2004/0031009 A1 Feb. 12, 2004

(51) Int. Cl.⁷ .............................................. G06F 17/50
(52) U.S. Cl. ......................... 716/1; 716/2; 977/DIG. 1
(58) Field of Search .................. 977/DIG. 1; 716/1–2, 716/7–14

(56) References Cited

U.S. PATENT DOCUMENTS 6,128,214 A * 10/2000 Kuekes et al. .............. 365/151
6,256,767 B1    7/2001 Kuekes et al. .................. 716/9
6,314,019 B1 * 11/2001 Kuekes et al. .............. 365/151
6,459,095 B1 * 10/2002 Heath et al. ................... 257/14
6,548,841 B2 *  4/2003 Frazier et al. ............... 257/254

OTHER PUBLICATIONS

G.L. Snider et al., "Quantum–Dot Cellular Automata," Int'l Microprocessors and Nanotechnology Conference, Jul. 1999, pp. 90–91.*

* cited by examiner

Primary Examiner—Leigh M. Garbowski

(57) ABSTRACT

A method and apparatus of reducing variations in nanoscale circuit connections. One exemplary embodiment includes: placing a first connector between a first addressing wire and a first nanowire in a partial circuit; and applying bias to the partial circuit so that a second connector is placed between a second addressing wire and a second nanowire. This method of bias connections is repeated for each wire in the full circuit. Thus, bias is used to influence the positioning of connectors on additional wires (if any) in the full circuit.

20 Claims, 6 Drawing Sheets

REDUCING VARIATION IN RANDOMIZED NANOSCALE CIRCUIT CONNECTIONS

TECHNICAL FIELD

Embodiments of the present invention relate generally to the field of circuits. More particularly, embodiments of the present invention permit reducing variation in randomized nanoscale circuit connections.

BACKGROUND

Nanoscale electronic circuits offer the possibility of high density, high speed, and low cost, compared to current devices. However, a major difficulty in nanoscale circuits is in establishing communication circuitry for input and output. Using multiplexers and demultiplexers as the interfacial circuits can address this problem. For example, FIG. 1 shows a basic multiplexer circuit 100, in which eight nanowires (marked as 1–8) can be addressed by three addressing wires (marked as A, B, and C). The dot at each cross point is a molecule switch such as a two-way AND element, which can be a resistor, diode, or a transistor. With the multiplexer 100 shown in FIG. 1, only one of the nanowires will be addressed by each combination of signals on A, B, and C (e.g., 1, 1, 0 for A, B, C, respectively, will address the nanowire 7). In general, such multiplexer/demultiplexer circuits allow n wires to address $2^n$ nanowires, which can establish efficient interfacial circuitry for nanoscale circuits.

Forming multiplexers/demultiplexers (or other circuits) requires the ability to selectively connect or disconnect nanowires and addressing wires at each cross point. Unfortunately, fabricating this precise pattern of logic elements at the intersections is very difficult at the nanometer scale.

One approach combines lithographic patterning for the more significant bits of the addresses with random connections for the less significant bits, as disclosed in commonly-assigned U.S. Pat. No. 6,256,767, by Kuekes et al., issued Jul. 3, 2001, entitled "DEMULTIPLEXER FOR A MOLECULAR WIRE CROSSBAR NETWORK (MWCN DEMUX)". U.S. Pat. No. 6,256,767 is fully incorporated herein by reference. In FIG. 1, addressing wire A specifies the most significant bit of the address and wire C specifies the least significant. As shown in FIG. 1, the more significant bits of the address involve large groups of adjacent nanowires with the same connections.

When sufficiently large, the groups can be created by patterns specified by conventional techniques such as photolithography. The less significant bits, on the other hand, require precise connections alternating on a fine scale, beyond current capabilities to precisely fabricate. The previous proposals address this problem by replacing precise connections with methods that make connections randomly, i.e., without precise control of their locations. This randomness precludes creating multiplexer circuits with the precise desired pattern of connections (e.g., as shown in FIG. 1). Nevertheless, the previous proposals show that adding a certain number of extra addressing wires ensures a high probability of unique addresses for the nanowires. In other words, the added redundancies may provide a high probability of correct functionality for the circuit. While these extra wires enable constructing a reliable interface circuit, they also disadvantageously increase the overall size of the circuit.

Therefore, current technologies are limited in their capabilities and suffer from at least the above constraints.

SUMMARY OF EMBODIMENTS OF THE INVENTION

In one embodiment of the invention, a method of reducing variations in nanoscale circuit connections, includes: placing a first connector between a first addressing wire and a first nanowire in a partial circuit; and applying bias to the partial circuit so that a second connector is placed between a second addressing wire and a second nanowire. This method of reducing variation by use of bias is repeated for each wire in the full circuit. Thus, bias is used to influence the positioning of connectors on additional wires (if any) in the full circuit.

In another embodiment, a nanoscale circuit, includes: a first addressing wire; a first nanowire; a first connector placed between the first addressing wire and a first nanowire in a partial circuit in a random manner; a second addressing wire; a second nanowire; and a second connector placed between the second addressing wire and a second nanowire by application of bias to the partial circuit.

In yet another embodiment, an apparatus for reducing variations in nanoscale circuit connections, includes: means for placing a first connector between a first addressing wire and a first nanowire in a partial circuit; and means for applying bias to the partial circuit so that a second connector is placed between a second addressing wire and a second nanowire.

In yet another embodiment, a method of reducing variations in nanoscale circuit connections, includes:

placing a first connector between a first addressing wire and a first nanowire in a partial circuit; and applying bias to the partial circuit to influence a positioning of a second connector on a second nanowire, the application of bias permitting a reduction in variance the number of connectors in each nanowire.

These and other features of an embodiment of the present invention will be readily apparent to persons of ordinary skill in the art upon reading the entirety of this disclosure, which includes the accompanying drawings and claims.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF PREFERRED EMBODIMENTS

In the description herein, numerous specific details are provided, such as examples of components and/or methods, to provide a thorough understanding of embodiments of the invention. One skilled in the relevant art will recognize, however, that an embodiment of the invention can be practiced without one or more of the specific details, or with other apparatus, systems, methods, components, materials, parts, and/or the like. In other instances, well-known structures, materials, or operations are not shown or described in detail to avoid obscuring aspects of embodiments the invention.

Embodiments of the invention advantageously reduce the number of additional addressing wires required to ensure reliable circuits from random connections. Arranging for some correlation among the random connections reduces the variation in the number of connections on different nanowires. This allows reliable addressing with fewer additional addressing wires, thereby reducing overall circuit size. In particular, if the connections are made randomly but in such a way so as to ensure the same number of connections to each nanowire, the number of additional addressing wires is reduced by about a factor of 2.5 (as discussed below).

Figure 1:
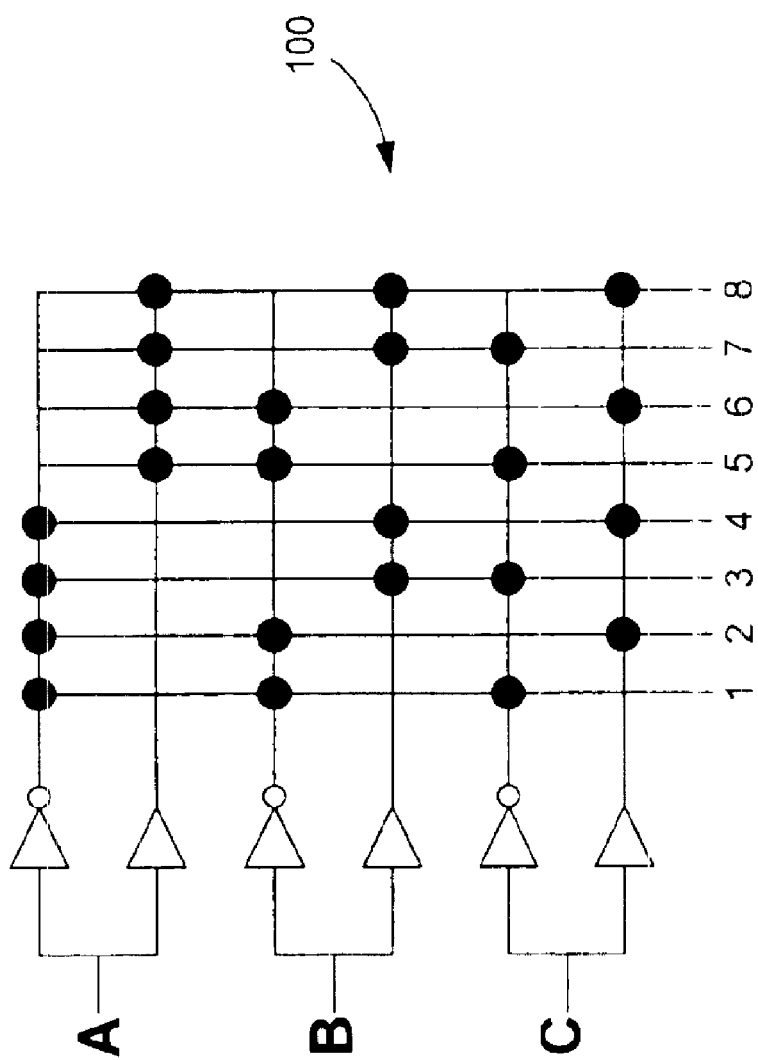
FIG. 1 is a block diagram of an example multiplexer circuit for purposes of background discussion.
Figure 2:
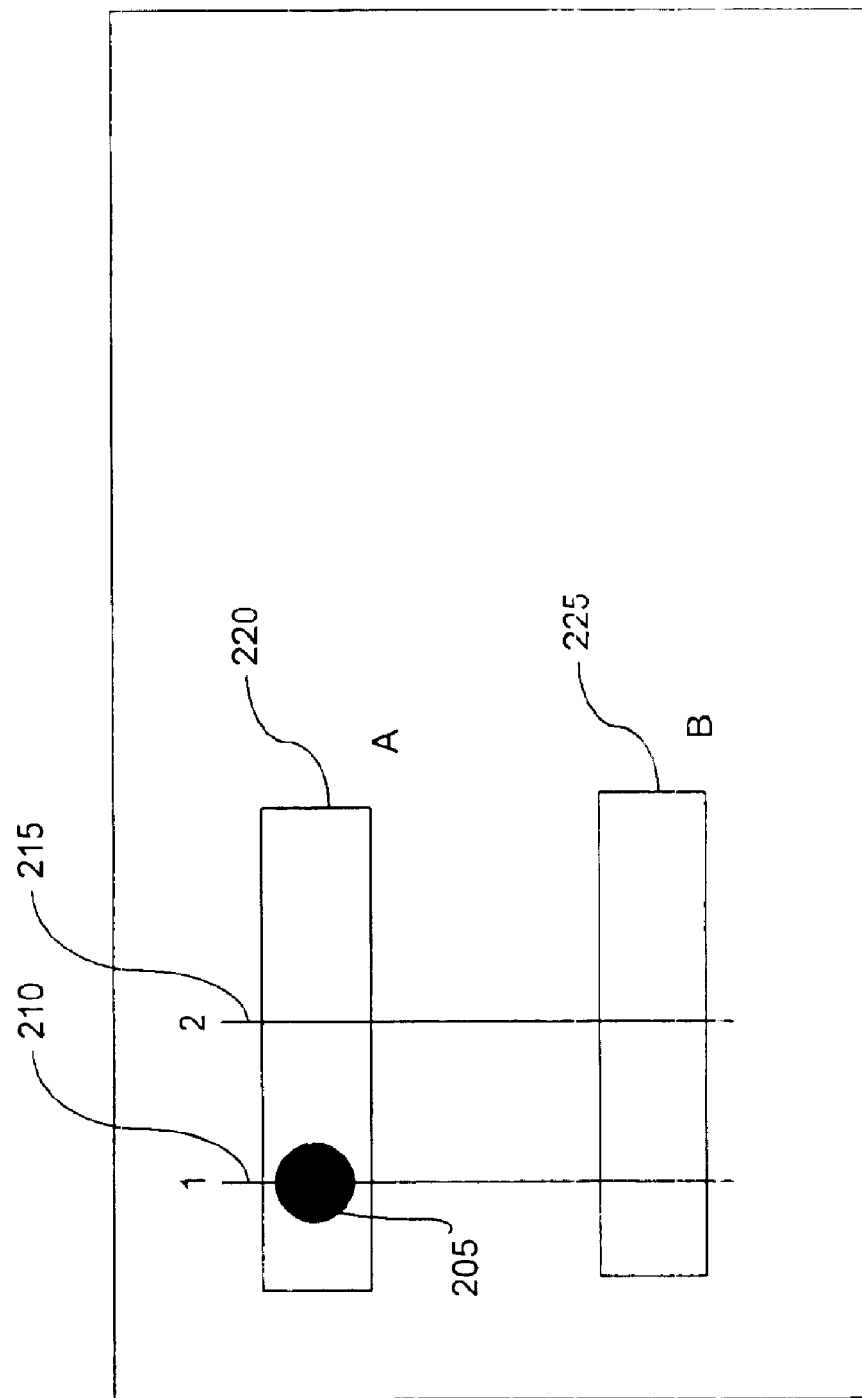
FIG. 2 is a block diagram illustrating a method of creating random connections with correlated placement, in accordance with an embodiment of the invention.

Referring now to FIG. 2, there is shown a block diagram of a method of creating random connections with correlated placement, in accordance with an embodiment of the invention. Assume that there are two nanowires 210 and 215 and two addressing wires 220 and 225. At this point, assume that a random connection have been made for the addressing wire (A) 220, giving the single connection ("molecule") 205 between the addressing wire 220 and the nanowire 210. The molecule 205 is commonly known as a switch molecule and is sandwiched at the intersection or junction of the two wires 210 and 220. Note that various examples of devices may be used as a molecule 205. Actual circuits may turn out to use somewhat different devices. As an example and as described in the above referenced U.S. Pat. No. 6,256,767 by Kuekes et al., when an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thus exponentially altering the rate of charge transport across the wire junction and serving as the basis for a switch.

The above molecules permit electronic devices to be formed with a size on the order of tens of nanometers to a few nanometers by simply making contact between two wires. By choosing the molecules which form a doping layer on the wires (modulation doping), it is possible to build devices with a wide variety of specifically desired electrical properties. The possibility of reversibly or even irreversibly changing the properties of the device via an electrochemical reaction with a large hysteresis loop in its I–V characteristic enables devices to be altered after they are built and may provide new and useful functions.

Figure 3:
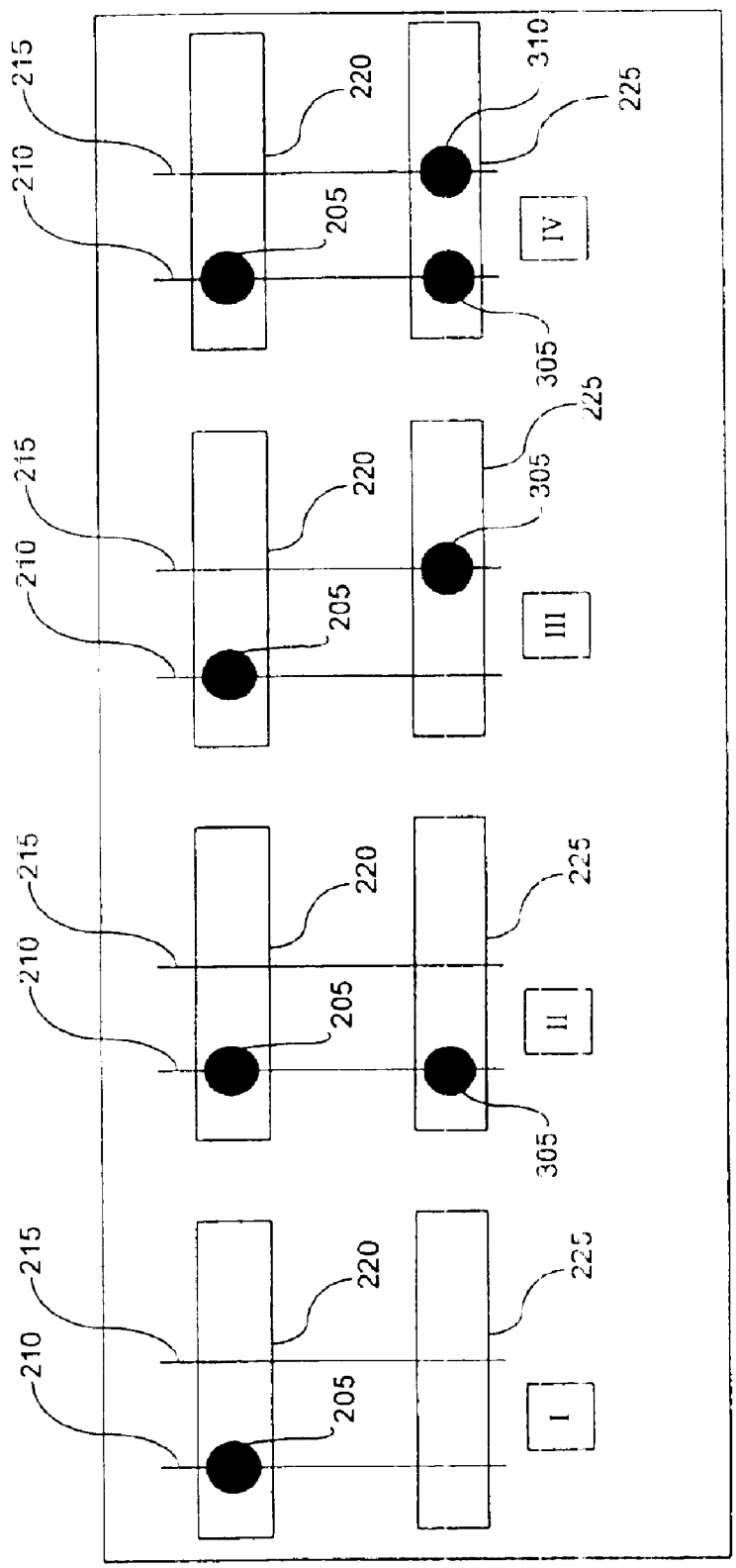
FIG. 3 is a block diagram illustrating various possible configurations by forming random connections.

If completely random connections are made to the addressing wire (B) 225, forming each connection with the probability ½, the possible resulting connections are shown as possibilities (configurations) I to IV in FIG. 3. A configuration may be part of a full circuit, or in some cases, may be the full circuit itself. Each of these possibilities in FIG. 3 has probability ¼. However, only configuration III has an equal number of connections (i.e., one) for both nanowires 210 and 215. In particular, a molecule 305 has been formed as connection between wires 215 and 225 in configuration III. If the addressing wires 220 and 225 were the only two addressing wires in a full circuit, then configuration III would also be the only configuration giving unique addresses for both wires.

In contrast, configurations I, II, and IV do not have an equal number of connections for both nanowires 210 and 215. For example, in configuration I, the molecule 210 is formed as a connection for nanowire 205, while no molecule is formed as a connection for nanowire 215. In configuration II, the molecules 205 and 305 are formed as connections for nanowire 210, while no molecule is formed as a connection for nanowire 215. In configuration IV, molecules 205 and 305 are formed as connections for nanowire 210, while only one molecule (molecule 310) is formed as a connection for nanowire 215.

Figure 4:
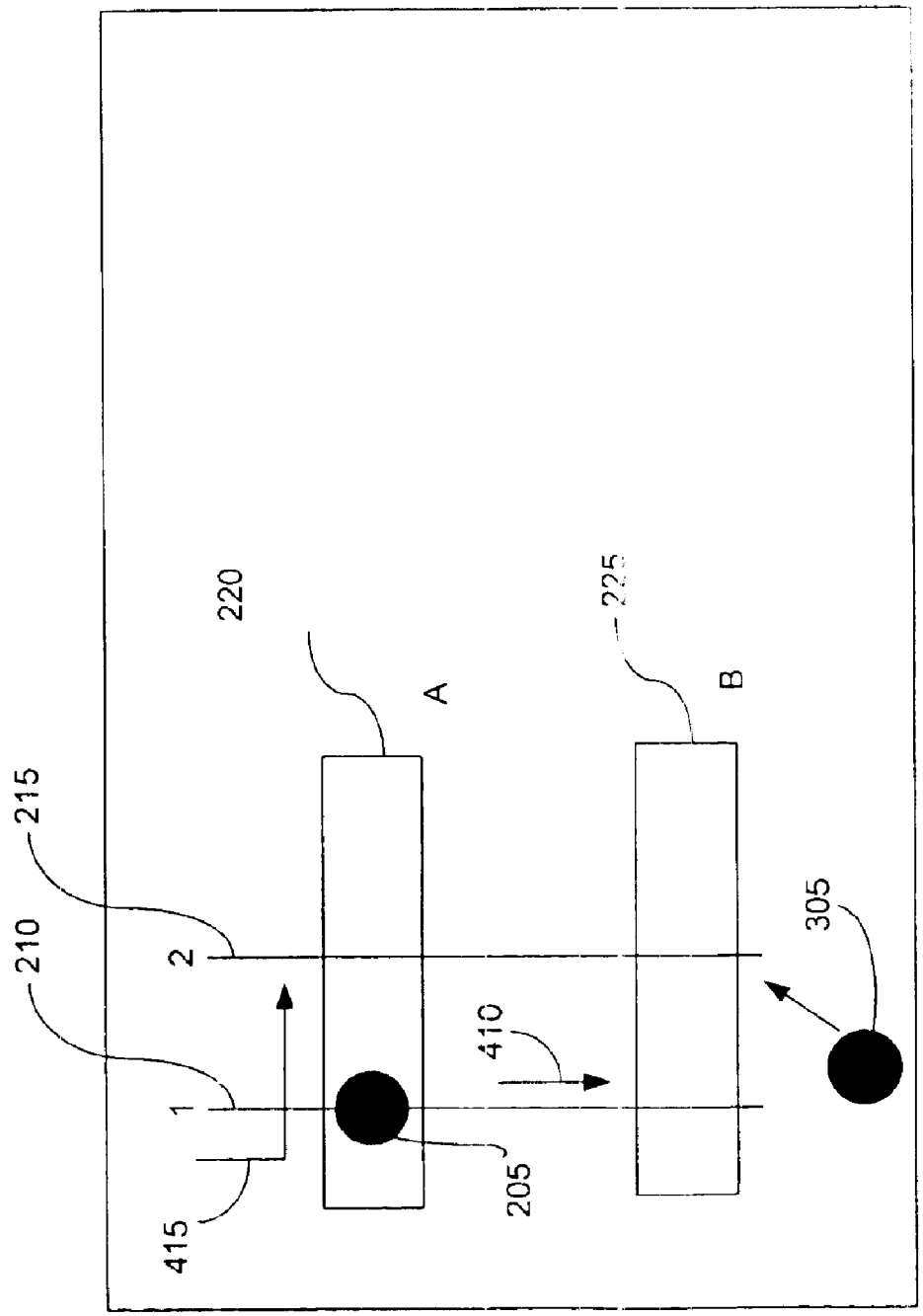
FIG. 4 is a block diagram illustrating a method of preferentially placing new connections on nanowires with relatively few connections (or no connections) from previously connected addressing wires.

To improve the situation where an equal number of connections are highly likely achieved for each nanowire, an embodiment of the invention provides a method of using an interaction among the partially connected wires and new connections to preferentially place new connections on nanowires with relatively few connections (or no connections) from previously connected addressing wires. For instance, after completing the connections (e.g., 205) to wire (A) 220, as shown in FIG. 4, introducing a voltage "V" on wire (A) 220 would produce a current 410 in nanowire 210 (because nanowire 210 is connected to wire 220), but would not produce a current in nanowire 215 (because nanowire 215 is not connected to wire 220). The function above is valid, provided that the ends of the nanowires 210 and 215 are grounded. It is also understood that the direction of current 410 depends on the potential of voltage V.

Alternatively, an embodiment of the invention provides a method where the existing connections (e.g., 205) could be used to place charge on the nanowires 210 and 215. Conversely, if an end of the addressing wire (A) 220 is grounded and voltage applied to all the nanowires (such as nanowires 210 and 215), a current 415 would flow in those wires connected to wire (A) 220, while those wires (e.g., nanowire 215) not connected to wire (A) 220 would be charged.

Thus, with suitable chemical properties of the molecule 205, the particular bias in the wires will cause a high probability that a second molecule 305 will be placed as a connection between wire (B) 225 and nanowire 215. The wires will be biased based upon the current flowing through or charges on (or lack of current or charges) particular ones of nanowires 210 and 215 and/or wires 220 and 225. A second molecule 305 will be attracted to (or repelled by) a wire with current flow or with charge, depending on the pre-selected chemical properties of the particular molecule 305.

In previous approaches, connections were made by adding enough material to make approximately half of the possible connections, but with no control over which particular connections are made. In contrast, an embodiment of the invention provides a method that achieves the following result. If new potential connectors (e.g., molecule 305) for wire (B) 225 are repelled by these currents or charges on connected wires (such nanowire 210 and wire 220 in the example of FIG. 4) and/or attracted to those currents (or lack of current) of unconnected wires (such as nanowire 215 and wire 225 in the example of FIG. 4), then the new potential connectors will preferentially connect to the wire with fewer connections (i.e., nanowire 215 in the example of FIG. 4). This result will raise the probability of obtaining the desirable configuration III as shown in FIG. 3. The new potential connectors will be attracted to, for example, wires with no currents or charges because the connectors themselves may be selected to have an opposite charge or are polarizable.

More generally, an embodiment of the invention provides a method that affects some property of the nanowires (e.g., nanowires 210 and 215) based on how many connections they already have from the random connections placed on previous addressing wires. If this property, in turn, makes new connections for subsequent addressing wires more likely to occur on nanowires with few connections, the resulting pattern of connections will be more uniform than if all connections are made independently at random. Ideally, the method would make it possible for each nanowire to receive the same number of connections (molecules). More realistically, in practice the method can be expected to substantially reduce, but not eliminate, the variation in number of connections (molecules) between nanowires, and this substantial reduction in variation advantageously reduces the number of additional addressing wires for a circuit, as discussed below.

The nanowires with especially few connections or many connections cause the most difficulty for forming unique addresses. As an extreme example, if any wire has no connections at all, then the wire is not addressable no matter what connections are made for other wires. Conversely, if a wire is connected to all the addressing wires, then addressing the wire will also address all other wires with one or more connections. Thus it is particularly useful to reduce the likelihood of these extreme cases or events. Even a relatively small bias in attracting new connections to wires with few existing connections, or repelling the new connections from wires with especially many existing connections, will be particularly helpful in avoiding the above-mentioned extreme cases.

The steps described in embodiments of the above methods may be performed by use of circuit fabrication equipment, along with testing equipment.

Reduction in Variation Reduces Number of Additional Required Addressing Wires

This section describes the benefit from reducing the above-mentioned variation, namely reducing the number of additional addressing wires to ensure unique addresses with high probability. In particular, if the connections are made randomly but in such a way so as to ensure the same number of connections to each nanowire, the number of additional addressing wires is reduced by about a factor of 2.5.

Figure 5:
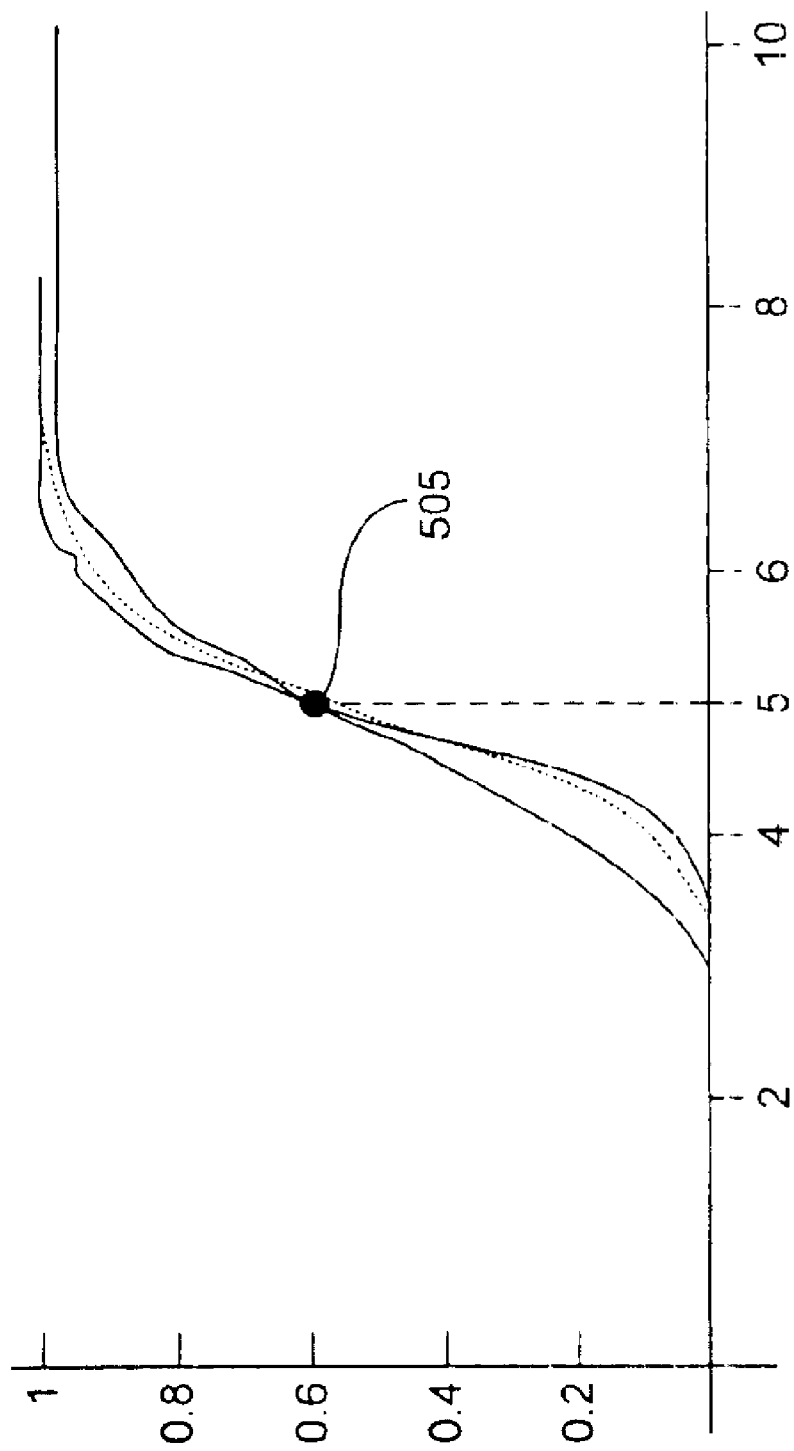
FIG. 5 is a graph illustrating a reduction in variation reduces the number of additional required addressing wires.

Reference is made to the graph in FIG. 5 to illustrate the requirements for forming unique addresses with random connections (molecules) by evaluating randomly generated samples. Specifically, to evaluate the ability to fully address N data wires (i.e., nanowires in this context) with M addressing wires, we generate a connectivity matrix in which each element is independently selected to be 1 with a specified probability p. We then compare the addresses of each pair of data wires (i.e., columns in the connectivity matrix) to see whether using one of the addresses would select both wires. If so, the address is not unique. Performing this check on each pair determines the number of uniquely addressable data wires for a particular connectivity matrix.

With a large number of data wires, the probability for unique addresses exhibits a sharp threshold with relatively few addressing wires. To see this, for p=0.5, FIG. 5 shows the probability for all data lines to have unique addresses as a function of $M/\log_2(N)$, for N=16, 32 and 64. In case the circuit has more wires than the numbers used in this illustration, these correspond to using random connections for the least significant 4, 5 or 6 bits of the addresses, respectively.

With this scaling, the thresholds overlap near 5, as shown by point 505. Thus the threshold occurs for $M\approx 5\log_2 N$.

When connections are completely random, the combinatorial expression for the probability for unique addresses is complicated. Nevertheless, we can estimate the location of the threshold by assuming each pair of wires can be considered independently. Consider the connections on two data wires, i and j. For each of these data wires to be separately addressable, there must be at least one addressing wire connecting to wire i but not wire j, and at least one other addressing wire with the opposite connections. The probability that an addressing wire connects to wire i but not j is $\alpha=p(1-p)$, and similarly for connecting to j but not i. Since the connections for each wire are made independently, for M addressing wires, the probability none connects to i but not j is $(1-\alpha)^M$. Similarly, for having none connecting to j but not i, the same expression $(1-\alpha)^M$. Finally, the probability for neither type of connection is $(1-2\alpha)^M$. Thus the probability this pair, at least, is correctly connected is $P_{pair}=1-2(1-\alpha)^M+(1-2\alpha)^M$.

For all wires to be uniquely addressable, every pair must be correctly connected. Under the approximation in which each pair's correctness is assumed to be independent of the others, the overall probability for unique addresses for all data wires is $P_{unique}=(P_{pair})^{\binom{N}{2}}$. For $0<p<1$, $0<\alpha\leq\frac{1}{4}$ with the maximum at $p=\frac{1}{2}$. To identify the threshold under this approximation, we consider the behavior when M and N are large. In this case, $$P_{unique} \approx \exp(-\binom{N}{2}2(1-\alpha)^M).$$

The threshold $P_{unique}=e^{-1}$ then corresponds to $N^2(1-\alpha)^M\approx 1$ or $$M \approx \frac{-2\ln(2)}{\ln(1-\alpha)}\log_2(N).$$

The coefficient is smallest when $p=\frac{1}{2}$, in which case it becomes $$M \approx \frac{-2\ln(2)}{\ln(3/4)}\log_2(N) \approx 4.8\log_2(N).$$

This expression is quite close to the observed threshold based on random samples, so the independence assumption is in fact fairly accurate.

To illustrate the benefit of reducing the variation in number of connections on the nanowires, consider the situation in which each data wire is connected to exactly h of the M addressing wires, but the choice of these connections is random. In this case, there are $$T = \binom{M}{h}$$

ways to pick the connections for a wire, each of which is equally likely. With N data wires, the addresses can be selected in $T^N$ ways, but they are all unique in only $T(T-1)\ldots(T-N+1)$ ways. Thus the probability the addresses are unique is the ratio of these quantities:

$$P_{unique} = \left(1-\frac{1}{T}\right)\cdots\left(1-\frac{N-1}{T}\right).$$

For a given number of wires N, the larger the number of choices T, the higher the probability all the addresses are unique. Since the binomial coefficients are largest in the middle of their range, T is maximum when $h=M/2$, i.e., when half the connections are made. When the number of possible addresses is much larger than the number of data wires (T>>N), $P_{unique}\approx e^{-N^2/(2T)}$. Defining the threshold location as $P_{unique}\approx e^{-1}$ then corresponds to $$T = \frac{1}{2}N^2.$$

Stirling's approximation for the binomial coefficient gives T growing as $T \approx e^{M\,H(h/M)}$ where $H(x)=-x\ln(x)-(1-x)\ln(1-x)$ is the entropy function. Thus the threshold condition becomes $$M \approx \frac{2}{H(h/M)} \ln(N).$$

The smallest threshold, corresponding to the largest value of the entropy, is when h=M/2, giving $$M \approx \frac{2}{\ln(2)} \ln(N) = 2\log_2 N.$$

In other words, when the number of connectors on each data wire is uniform, then the threshold is at approximately 2, as shown in FIG. 5, and this indicates that fewer addressing wires are required to give a high probability for correct addressing for the full circuit.

This discussion not only shows why the number of addressing wires required to reach the threshold grows only logarithmically, but also indicates the difference between two methods of producing random connections: 1) random connections constrained to have exactly the same number of connections per data wire, and 2) random connections made completely independently, i.e., with no constraint. Specifically, the thresholds for these cases is at $2 \log_2(N)$ and about $5 \log_2(N)$, respectively, as shown in FIG. 5. Thus, even though both methods give the same number of connections on average, the variation in the number of connections in the second case increases the likelihood of duplicate addresses. This difference shows the potential for reducing the number of addressing wires by reducing the variation in number of connections made to each wire.

Figure 6:
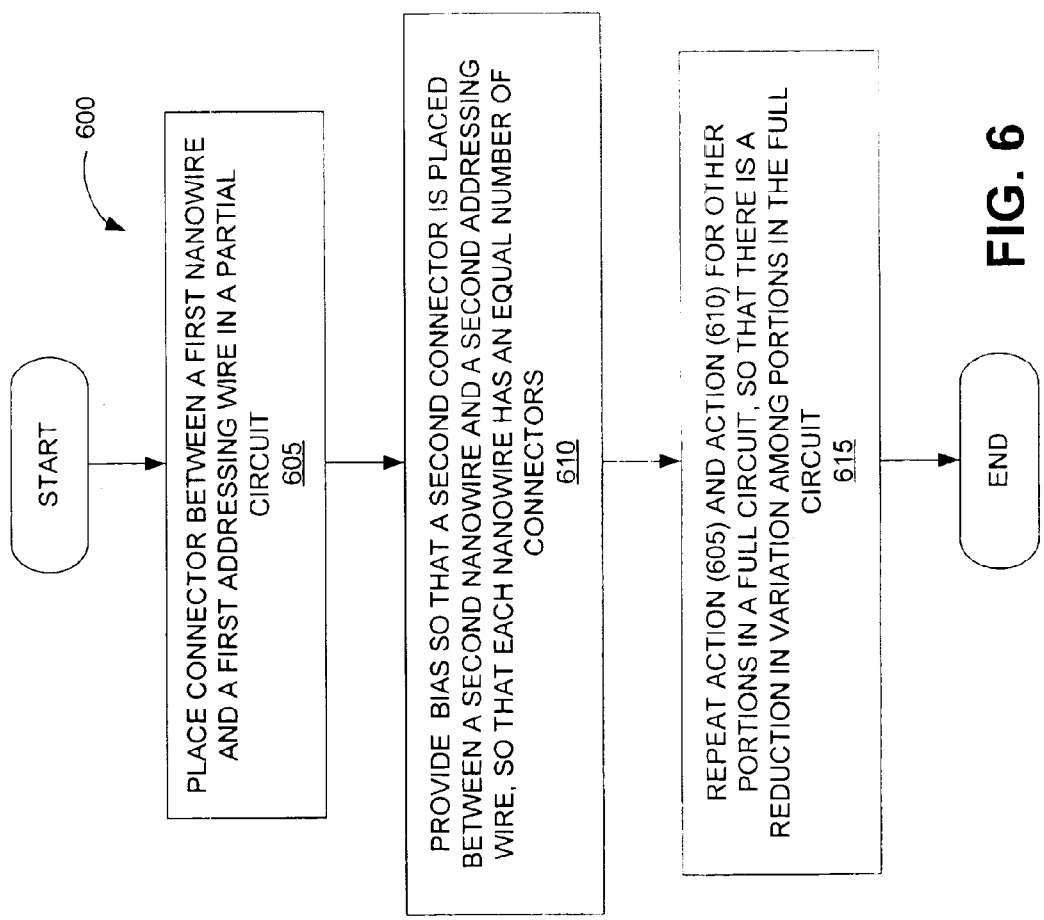
FIG. 6 is a flowchart illustrating a method of reducing variation in randomized nanoscale circuit connections, in accordance with an embodiment of the invention.

FIG. 6 is a method 600 of reducing variation in randomized nanoscale circuit connections, in accordance with an embodiment of the invention. A connector (molecule) is placed (605) between a first nanowire and a first addressing wire in a partial circuit. A bias is then provided (610) in the partial circuit so that a second connector (molecule) is placed between a second nanowire and a second addressing wire, so that each nanowire in the partial circuit has an equal number of connectors or the number of connectors in each nanowire is reduced in variance. Various methods of providing the bias in the partial circuit have been previously described above. The action (605) and action (610) above may be repeated (615) for other partial circuits (if any) that will form the full circuit, so that the number of connectors in each nanowire in the full circuit is reduced in variance.

When a first connector is placed in another partial circuit that will form the full circuit (i.e., the connectors have already been placed in the first partial circuit that will form the full circuit), the first connector will also be influenced by the bias in the first part of the circuit. Thus, only the very first connector in the full circuit is placed randomly.

For purposes of describing an embodiment of the invention, action (610) in FIG. 6 illustrates the ideal case where the bias may permit each nanowire to have an equal number of connectors (as discussed above). However, in practice, typically the bias may only reduce the variation in the number of connectors for each nanowire.

Application to Other Circuits

Sharp statistical thresholds give reliability from random connections. The precise location of the thresholds, and hence the extra components required to achieve reliability, depends on the breadth of the distribution in individual circuit composition. Reducing variance can thus reduce circuit size. On the other hand, introducing correlations may make the fabrication process for the individual components more complicated than using uniform random choices.

It is further noted that the above-mentioned methods for reducing variance, in order to reduce the number of wires, may apply to other types of circuits besides multiplexers and demultiplexers.

Reference throughout this specification to "one embodiment", "an embodiment", or "a specific embodiment" means that a particular feature, structure, or characteristic described in connection with the embodiment is included in at least one embodiment of the present invention. Thus, the appearances of the phrases "in one embodiment", "in an embodiment", or "in a specific embodiment" in various places throughout this specification are not necessarily all referring to the same embodiment. Furthermore, the particular features, structures, or characteristics may be combined in any suitable manner in one or more embodiments.

Other variations and modifications of the above-described embodiments and methods are possible in light of the foregoing teaching. Further, at least some of the components of an embodiment of the invention may be implemented by using a programmed general purpose digital computer, by using application specific integrated circuits, programmable logic devices, or field programmable gate arrays, or by using a network of interconnected components and circuits. Connections may be wired, wireless, by modem, and the like.

It will also be appreciated that one or more of the elements depicted in the drawings/figures can also be implemented in a more separated or integrated manner, or even removed or rendered as inoperable in certain cases, as is useful in accordance with a particular application.

It is also within the scope of the present invention to implement a program or code that can be stored in a machine-readable medium to permit a computer to perform any of the methods described above.

Additionally, the signal arrows in the drawings/Figures are considered as exemplary and are not limiting, unless otherwise specifically noted. Furthermore, the term "or" as used in this disclosure is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method of reducing variations in nanoscale circuit connections, the method comprising:
   placing a first connector between a first addressing wire and a first nanowire in a partial circuit; and
   applying bias to the partial circuit so that a second connector is placed between a second addressing wire and a second nanowire, wherein applying the bias permits a reduction in variance in a number of connectors in each nanowire.

2. The method of claim 1, wherein applying the bias comprises:
   introducing a voltage on at least the first addressing wire.

3. The method of claim 1, wherein applying the bias comprises:
   placing a charge on the first nanowire and second nanowire.

4. The method of claim 1, further comprising:
   placing a first connector between a first addressing wire and a first nanowire in another partial circuit that will form a full circuit; and
   applying bias to the another partial circuit so that a second connector is placed between a second addressing wire and a second nanowire in the another partial circuit so as to reduce variance in the number of connectors.

5. The method of claim 1, wherein a reduction in variance in the number of connectors in each nanowire permits a reduction in a number of addressing wires.

6. The method of claim 4, wherein a reduction in variance in the number of connectors in each nanowire permits a reduction in a number of addressing wires.

7. A nanoscale circuit produced in accordance with the method of claim 1.

8. A nanoscale circuit produced in accordance with the method of claim 4.

9. An apparatus for reducing variations in nanoscale circuit connections, the apparatus comprising:
   means for placing a first connector between a first addressing wire and a first nanowire in a partial circuit; and
   means for applying bias to the partial circuit so that a second connector is placed between a second addressing wire and a second nanowire, wherein the bias permits a reduction in variance in a number of connectors in each nanowire.

10. A nanoscale circuit, comprising:
   a first addressing wire;
   a first nanowire;
   a first connector placed between the first addressing wire and a first nanowire in a partial circuit in a random manner;
   a second addressing wire;
   a second nanowire; and
   a second connector placed between the second addressing wire and a second nanowire by application of bias to the partial circuit.

11. The nanoscale circuit of claim 10, wherein application of the bias permits a reduction in variance in a number of connectors in each nanowire.

12. The nanoscale circuit of claim 10, wherein the bias is applied to the partial circuit by introduction of a voltage on at least the first addressing wire.

13. The nanoscale circuit of claim 10, wherein the bias is applied to the partial circuit by placement of a charge on the first nanowire and second nanowire.

14. The nanoscale circuit of claim 10, wherein:
   another connector is placed between a first addressing wire and a first nanowire in another partial circuit that will form a full circuit; and
   applying bias to the another partial circuit so that an additional connector is placed between a second addressing wire and a second nanowire in the another partial circuit.

15. The nanoscale circuit of claim 10, further comprising:
   a first addressing wire in another partial circuit;
   a first nanowire in the another partial circuit;
   a first connector placed between the first addressing wire and a first nanowire in the another partial circuit;
   a second addressing wire in the another partial circuit;
   a second nanowire in the another partial circuit;
   a second connector placed between the second addressing wire and a second nanowire in the another partial circuit by application of bias to the partial circuit.

16. A method of reducing variations in nanoscale circuit connections, comprising:
   placing a first connector between a first addressing wire and a first nanowire in a partial circuit; and
   applying bias to the partial circuit to influence a positioning of a second connector on a second nanowire.

17. The method of claim 16, further comprising:
   applying bias to influence positioning of connectors on additional wires in a full circuit so as to reduce variance in a number of connectors.

18. A method, comprising:
   placing, in a nanoscale circuit, a first connector between a first addressing wire and a first nanowire;
   applying a bias to the nanoscale circuit; and
   placing, while applying the bias to the nanoscale circuit, a second connector between a second addressing wire and a second nanowire to influence a placement location of the second connector on the nanoscale circuit.

19. The method of claim 18 wherein placing while applying the bias to the nanoscale circuit further comprises introducing a voltage on at least the first addressing wire to influence the placement location of the second connector on the nanoscale circuit.

20. The method of claim 18 wherein placing while applying the bias to the nanoscale circuit further comprises introducing a charge on the first and second nanowires to influence the placement location of the second connector on the nanoscale circuit.

* * * * *